United States Patent [19]
Bajor et al.

[11] Patent Number: 5,395,774
[45] Date of Patent: Mar. 7, 1995

[54] METHODS FOR FORMING A TRANSISTOR HAVING AN EMITTER WITH ENHANCED EFFICIENCY

[75] Inventors: George Bajor, Melbourne; Anthony L. Rivoli, Palm Bay; Jack H. Linn, Melbourne, all of Fla.

[73] Assignee: Harris Corporation, Melbourne, Fla.

[21] Appl. No.: 123,157

[22] Filed: Sep. 7, 1993

[51] Int. Cl.⁶ .......................................... H01L 21/265
[52] U.S. Cl. ...................... 437/31; 437/186; 437/946
[58] Field of Search ............... 437/31, 32, 186, 946; 148/DIG. 17; 427/122, 228

[56] References Cited
U.S. PATENT DOCUMENTS

| | | | |
|---|---|---|---|
| 5,028,973 | 7/1991 | Bajor | 357/34 |
| 5,198,263 | 3/1993 | Stafford et al. | 427/122 |
| 5,244,535 | 9/1993 | Ohtsuka et al. | 437/946 |
| 5,296,094 | 3/1994 | Shan et al. | 156/651 |

Primary Examiner—Olik Chaudhuri
Assistant Examiner—Brian K. Dutton
Attorney, Agent, or Firm—Rogers & Killeen

[57] ABSTRACT

Methods of forming a carbon containing, minority carrier barrier layer on the surface of a semiconductor, which methods may be used to form barriers between the emitter of a single crystal transistor and a polysilicon layer in electrical contact therewith, and thus transistors with an emitter with enhanced efficiency.

25 Claims, 2 Drawing Sheets

METHODS FOR FORMING A TRANSISTOR HAVING AN EMITTER WITH ENHANCED EFFICIENCY

BACKGROUND OF THE INVENTION

Single crystal bipolar transistors with high efficiency emitters are known and are described and claimed in U.S. Pat. No. 5,028,973 dated Jul. 2, 1991 and assigned to the assignee thereof, the disclosure thereof being hereby incorporated herein by reference. In such transistors, emitter efficiency is enhanced by the imposition of a minority carrier barrier layer between the single crystal silicon emitter and the polycrystalline silicon layer through which an electrical connection is established to the emitter. This barrier layer is a wide bandgap semiconducting material such as silicon carbide or amorphous silicon.

While the structure of such transistors is known, there are many practical difficulties in the creation of the structure. For example, emitters may be formed in any conventional manner in a base and silicon carbide thereafter deposited on the emitter surface and between the emitter and the polycrystalline silicon emitter contact. This process requires patterning to remove unwanted carbon to prevent contamination of the remainder of the wafer. In practice, the imperfect alignment of the pattern will always leave some unwanted carbon on the wafer.

Alternatively, carbon may be deposited directly onto the emitter surface and thermally reacted to form silicon carbide, but the same disadvantages exist as described above, with the additional difficulty that elemental carbon is much more difficult to remove that silicon carbide.

A second alternative is to form the emitter by out diffusing the emitter dopant from the polysilicon contact after deposition on the single crystal silicon base. However, the introduction of the carbide layer between the polycrystalline silicon and the single layer crystal silicon results in the disadvantages discussed above.

It is accordingly an object of the present invention to obviate these problems and to provide a novel method of achieving a minority carrier barrier layer on the surface of a semiconductor.

It is another object of the present invention to provide a novel method of achieving a carbon containing layer between a semiconductor and a polysilicon contact layer.

It is still another object of the present invention to provide a novel method of creating a single crystal bipolar transistor with a high efficient emitter.

It is yet another object of the present invention to provide a novel method of creating a single crystal bipolar transistor with a high efficient emitter in which the emitter is established subsequently to the establishment of the polysilicon contact layer.

It is a further object of the present invention to provide a novel method of creating a single crystal bipolar transistor with a high efficient emitter which is relative inexpensive and which uses readily available semiconductor processing technology.

These and many other objects and advantages will be readily apparent to one skilled in the art to which the invention pertains from the claims and from a perusal of the following detailed description of preferred embodiments when read in conjunction with the appended drawings.

DESCRIPTION OF PREFERRED EMBODIMENTS

Figure 1A:
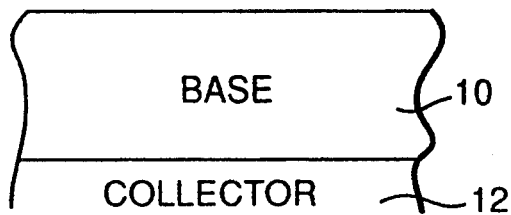
FIGS. 1 (A) through 1 (D) illustrate in partial section a semiconductor wafer on which the steps of one method of forming a transistor with an emitter with enhanced efficiency are performed.

With reference now to the drawings where like elements have been given like numeric designation to facilitate an understanding thereof, FIG. 1(A) illustrates in partial cross-section a semiconductor wafer with a base region 10 overlying a collector region 12, both regions being doped in a conventional manner to create a single crystal PN junction.

As illustrated in FIG. 1(B), a layer 14 of a carbon containing polymer is formed on the exposed upper surface of the base region 10. This layer may be formed in a number of ways, but preferably is formed by initially forming a thin chemical oxide on silicon by exposure in a suitable conventional process to a $H_2SO_4$/$H_2O_2$ solution, by then exposing the substrate to a plasma etch environment in which the gas mixture consists primarily of $CHF_3$. This process removes the oxide, exposes the underlying silicon, and deposits a fluorocarbon on the exposed silicon. The thickness of the carbon containing polymer may be controlled by the inclusion of small amounts of oxygen in the plasma gas mixture.

Figure 1:
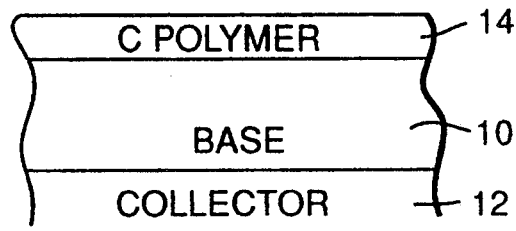
Figure 3:
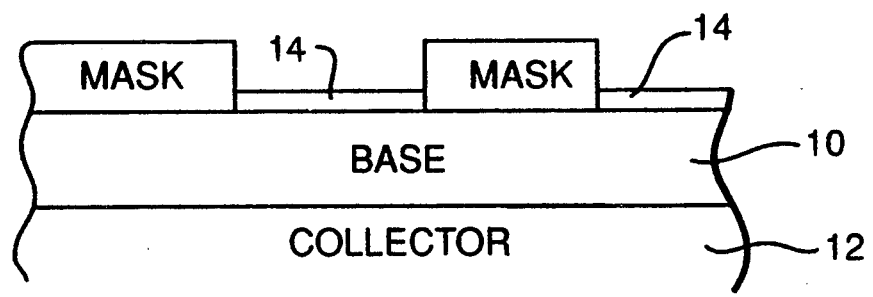
FIG. 3 illustrates in partial section a semiconductor wafer enlarged to show the patterning of the area of formation of the carbon containing polymer.

For a patterned wafer such as shown in FIG. 3, the carbon containing polymer layer 14 of FIG. 1 (B) may be restricted by the masking material where the fluorocarbon is deposited only where silicon is exposed.

Figure 1C:
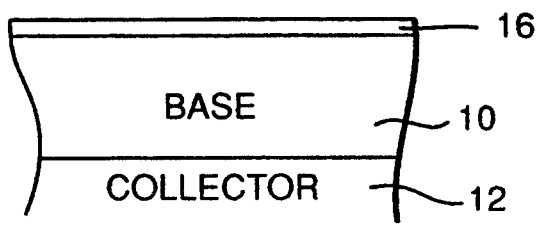

Once the carbon containing polymer layer 14 has been formed, it is subjected to sufficient heat to effect destructive distillation thereof. A temperature of at least 400° C. is required, with 580° C. to 620° C. being the accepted standard and 620° C. being preferred. As a result of the elevated temperature, the fluorine and hydrogen are driven off leaving a carbon residue 16, possibly in the form of silicon carbide, on the surface of the semiconductor as shown in FIG. 1(C).

Figure 1D:
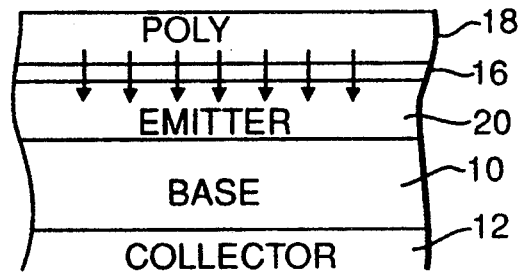

Thereafter, a layer of polycrystalline silicon 18 may be deposited over the carbon residue 16 as shown in FIG. 1(D) to produce a carbon residue 16 on the surface of the semiconductor between the single crystalline silicon and the polycrystalline silicon.

Once the polysilicon is highly doped, the dopants may be outdiffused (as shown by the arrows) through the carbon containing layer 16 into the base region of the semiconductor to thereby create an emitter region 20 therein.

Other steps in the formation of an operable transistor are conventional, and the doping may be such that either PNP or NPN transistors are formed.

The foregoing description illustrates a preferred process. However, the formation of an oxide prior to polymer formation is optional, and if formed, may be chemically or thermally formed or physically deposited. Similarly, the gas mixture of the plasma etch environment may be varied so long as it contains carbon, fluorine and hydrogen, and the polycrystalline silicon layer replaced by amorphous silicon or other semiconducting material.

Figure 2A:
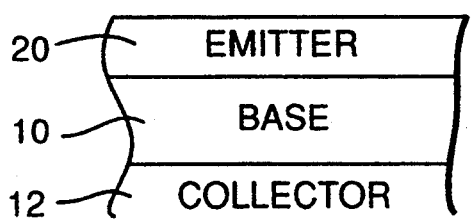
FIGS. 2 (A) through 2 (D) illustrate in partial section a semiconductor wafer on which the steps of another method of forming a transistor with an emitter with enhanced efficiency are performed.

An alternative method is disclosed in FIG. 2 where the three regions of the transistor are formed in a conventional manner so that there is provided as shown in FIG. 2(A) an emitter 20 with an exposed surface, a base 10 and a collector 12.

Figure 2B:
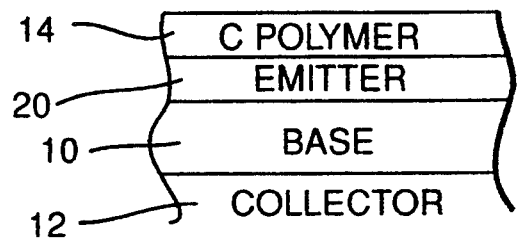
Figure 2C:
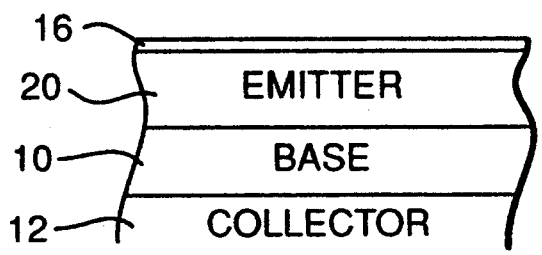

As illustrated in FIG. 2(B), and as earlier described in connection with the process of FIG. 1, a carbon containing layer 14 may be formed on the surface of the emitter 20, preferably after the surface is oxidized. This polymer may be destructively distilled to provide a carbon containing residue 16 as shown in FIG. 2(C).

Figure 2D:
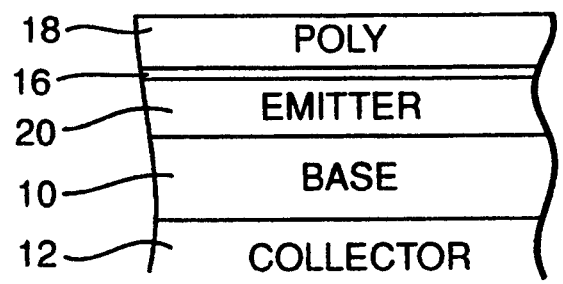

As shown in FIG. 2(D), a layer of polycrystalline silicon 18 may then be deposited in a conventional manner over the carbon containing residue 16. The polysilicon 18 may be undoped since the need for out diffusing the dopants through the barrier layer 16 into the base region to form the emitter is not required.

ADVANTAGES AND SCOPE OF INVENTION

Through the novel process described above, the problem of unwanted carbon on the wafer may be obviated in the production of a minority carrier barrier layer on the surface of a semiconductor. This carbon containing layer may be located between the semiconductor surface and a polysilicon contact layer and may be sued to create a single crystal bipolar transistor with a high efficient emitter.

It is a significant advantage that such a single crystal bipolar transistor with a high efficient emitter may be created in which the emitter is established subsequently to the establishment of the polysilicon contact layer. By the use of readily available semiconductor processing technology, the expense may be significantly reduced.

While preferred embodiments of the present invention have been described, it is to be understood that the embodiments described are illustrative only and the scope of the invention is to be defined solely by the appended claims when accorded a full range of equivalence, many variations and modifications naturally occurring to those skilled in the art from a perusal hereof.

What is claimed is:

1. A method of forming a carbon containing, minority carrier barrier layer between a first layer of single crystal silicon and a second layer of polycrystalline silicon though which electrical contact to the single crystal silicon layer may be made, the method comprising the steps of:
   a) providing a layer of single crystal silicon having an exposed surface area;
   b) oxidizing the exposed surface area of the single crystal silicon;
   c) plasma treating the oxidized surface to remove the oxide thereby forming a carbon containing polymer;
   d) subjecting the polymer to destructive distillation; and
   e) depositing a polycrystalline silicon layer over the residue of the destructive distillation,
   to thereby form a carbon containing, minority carrier barrier layer between the first layer of single crystal silicon and the second layer of polycrystalline silicon.

2. The method of claim 1 wherein the plasma contains carbon, hydrogen and fluorine and only trace amounts of oxygen; and
   wherein destructive distillation of the polymer is achieved by raising the temperature thereof to approximately 600° C.

3. A method of forming a carbon containing barrier layer between the single crystal silicon emitter of a bipolar transistor and a polycrystalline silicon layer through which electrical contract with the emitter is made comprising the steps of:
   a) providing a single crystal silicon bipolar transistor having a base, collector and an emitter with an exposed surface area;
   b) oxidizing the exposed surface area of the emitter;
   c) plasma treating the oxidized surface of the emitter to remove the oxide thereby forming a carbon containing polymer thereon
   d) subjecting the polymer to destructive distillation; and
   e) depositing a polycrystalline silicon layer over the residue of the destructive distillation
   to thereby form a carbon containing barrier layer between the single crystal emitter and the polycrystalline silicon layer through which electrical contract with the emitter may be made.

4. The method of claim 3 wherein the plasma contains carbon and wherein the distillation results from exposure to 600° C.

5. A method of forming a bipolar transistor with an enhanced emitter efficiency comprising the steps of:
   a) providing a transistor with an exposed base surface;
   b) creating a carbon containing polymer on the exposed base surface;
   c) raising the temperature of the carbon containing polymer sufficiently to leave a carbon containing residue thereon;
   d) forming a layer of doped polycrystallne silicon on the carbon containing residue; and
   e) diffusing dopants from the polycrystalline silicon layer through the carbon containing residue into the base surface.

6. A method of forming a bipolar transistor with an enhanced emitter efficiency comprising the steps of:
   a) providing a transistor with an exposed emitter surface;
   b) creating a carbon containing polymer on the exposed emitter surface;
   c) raising the temperature of the carbon containing polymer sufficiently to leave a carbon containing residue thereon; and
   d) forming a layer of polycrystalline silicon on the carbon containing residue.

7. A method of providing a carbon containing, minority carrier barrier layer on the surface of a semiconductor comprising the steps of:
   a) providing a semiconductor surface;
   b) creating a carbon containing polymer on the surface; and
   c) heating the polymer sufficiently to provide a carbon containing residue
   whereby a carbon containing, minority carrier barrier layer is formed on the surface of the semiconductor.

8. The method of claim 7 wherein the polymer is formed by exposing the semiconductor surface to a plasma containing carbon.

9. The method of claim 8 wherein the plasma also contains fluorine.

10. The method of claim 9 wherein the plasma also contains hydrogen.

11. The method of claim 8 wherein the plasma contains only trace amounts of oxygen.

12. The method of claim 7 wherein the temperature of the polymer is raised to at least 400° C. to provide a carbon containing residue.

13. The method of claim 12 wherein the temperature is raised to between about 580 and 620 degrees C.

14. The method of claim 7 including the further step of contacting the surface with an acid prior to the creation of the polymer.

15. The method of claim 14 wherein the acid includes a silicon oxidant.

16. The method of claim 15 wherein the acid includes sulfuric acid and hydrogen peroxide.

17. The method of claim 7 wherein the carbon containing polymer contains fluorine and hydrogen.

18. The method of claim 17 wherein the carbon containing polymer contains only trace oxygen.

19. The method of claim 7 wherein the carbon containing polymer is created by plasma treating surface with a carbon containing gas.

20. The method of claim 7 including the further step of chemically forming an oxide on the base prior to creating the carbon containing polymer.

21. The method of claim 20 wherein the polymer is formed by plasma treating of the oxidized surface with a fluorine containing gas.

22. The method of claim 7 with the additional step of providing a layer of polycrystalline silicon on the carbon containing residue.

23. The method of claim 22 wherein the semiconductor surface is doped.

24. The method of claim 23 wherein the polycrystalline silicon is doped; and including the further step of diffusing the dopants through the carbon containing residue into the surface.

25. The method of claim 23 including the step of doping the semiconductor surface prior to the addition of the polycrystalline silicon layer.

* * * * *